United States Patent
Auchere et al.

(10) Patent No.: US 11,482,487 B2
(45) Date of Patent: Oct. 25, 2022

(54) ELECTRONIC DEVICE COMPRISING A CHIP AND AT LEAST ONE SMT ELECTRONIC COMPONENT

(71) Applicants: STMicroelectronics (Grenoble 2) SAS, Grenoble (FR); STMicroelectronics (Alps) SAS, Grenoble (FR)

(72) Inventors: David Auchere, Meylan (FR); Claire Laporte, Grenoble (FR); Deborah Cogoni, Notre Dame de l'osier (FR); Laurent Schwartz, La Buisse (FR)

(73) Assignees: STMicroelectronics (Grenoble 2) SAS, Grenoble (FR); STMicroelectronics (Alps) SAS, Grenoble (FR)

(*) Notice: Subject to any disclaimer, the term of this patent is extended or adjusted under 35 U.S.C. 154(b) by 0 days.

(21) Appl. No.: 17/064,119

(22) Filed: Oct. 6, 2020

(65) Prior Publication Data
US 2021/0104457 A1   Apr. 8, 2021

(30) Foreign Application Priority Data
Oct. 8, 2019 (FR) .................................. 1911129

(51) Int. Cl.
*H01L 23/50* (2006.01)
*H01L 23/31* (2006.01)

(52) U.S. Cl.
CPC ............ *H01L 23/50* (2013.01); *H01L 23/315* (2013.01); *H01L 23/3128* (2013.01)

(58) Field of Classification Search
CPC .... H01L 23/50; H01L 23/315; H01L 23/3128
See application file for complete search history.

(56) References Cited

U.S. PATENT DOCUMENTS

| | | | |
|---|---|---|---|
| 2003/0073349 A1 | 4/2003 | Nagao et al. | |
| 2011/0084380 A1* | 4/2011 | Kwon | H01L 23/13 257/724 |
| 2014/0190930 A1 | 7/2014 | Mayo et al. | |
| 2017/0287736 A1 | 10/2017 | Oster et al. | |
| 2018/0151501 A1* | 5/2018 | Yu | H01L 23/3114 |
| 2020/0194379 A1* | 6/2020 | Kim | H01L 21/563 |

FOREIGN PATENT DOCUMENTS

EP   2595462 A2   5/2013

OTHER PUBLICATIONS

INPI Search Report and Written Opinion for FR 1911129 dated Apr. 7, 2020 (10 pages).

* cited by examiner

*Primary Examiner* — Peniel M Gumedzoe
(74) *Attorney, Agent, or Firm* — Crowe & Dunlevy

(57) ABSTRACT

An electronic device includes a carrier substrate with an electronic IC chip mounted on top of the carrier substrate. An encapsulation block on top of the front face of the carrier substrate embeds the IC chip. The encapsulation block has a through-void for positioning and confinement that extends through the encapsulation block to the top of the carrier substrate. At least one electronic component is positioned within the through-void and mounted to the top of the carrier substrate. Solder bumps or pads are located within the through-void to electrically connect the at least one electronic component to the carrier substrate.

20 Claims, 1 Drawing Sheet

ELECTRONIC DEVICE COMPRISING A CHIP AND AT LEAST ONE SMT ELECTRONIC COMPONENT

PRIORITY CLAIM

This application claims the priority benefit of French Application for Patent No. 1911129, filed on Oct. 8, 2019, the content of which is hereby incorporated by reference in its entirety to the maximum extent allowable by law.

TECHNICAL FIELD

The present invention relates to the field of microelectronics.

BACKGROUND

Electronic devices are known in the art that include electronic integrated circuit (IC) chips and electronic components, referred to as surface mount technology (SMT) components, mounted on top of carrier substrates. An encapsulation block collectively embeds the electronic IC chips and the electronic components.

SUMMARY

According to one embodiment, what is proposed is an electronic device that comprises: a carrier substrate having a front face for mounting and a back face; at least one electronic integrated circuit (IC) chip on top of the front face of the carrier substrate and connected to first front electrical contacts of the front face of the carrier substrate; at least one electronic component on top of the front face of the carrier substrate and provided with electrical connection terminals that are connected to second front electrical contacts of the front face of the carrier substrate by solder bumps or pads; and an encapsulation block on top of the front face of the carrier substrate, in which the electronic IC chip is embedded.

The encapsulation block has a through-void for positioning and confinement, reaching the front face of the carrier substrate, in which the electronic component and the solder bumps are located. The through-void and the electronic component are configured such that there is a clearance between the flanks of the through-void and the flanks of the electronic component and that the orientation of the electronic component, parallel to the front face of the carrier substrate, is limited by at least two opposite flanks of the through-void for positioning and confinement.

Thus, the electronic component is correctly placed with respect to the second electrical contacts of the carrier substrate.

The distance between the opposite flanks of the through-void for positioning and confinement is smaller than the largest dimension of the electronic component parallel to the front face of the carrier substrate.

The electrical connection terminals of the electronic component may be located above the second electrical contacts.

The second electrical contacts may extend beyond the electronic component.

The electrical connection terminals may be formed at opposite ends of the electronic component.

The carrier substrate may be provided with an integrated network of electrical connections from one face to the other, including the first and second electrical contacts.

The device may comprise a stack of corresponding electronic components that are located one on top of the other in the through-void for positioning and confinement and have corresponding electrical connection terminals that are connected to one another and to the second front electrical contacts of the network of electrical connections by the solder bumps or pads.

What is also proposed is a process for producing an electronic device, which process comprises the following steps: mounting an electronic integrated circuit (IC) chip on top of a front, mounting face of a carrier substrate and connecting to first electrical contacts of the front face of a carrier substrate; forming an encapsulation block on top of the front face of the carrier substrate, in which the electronic IC chip is embedded; making a through-void for positioning and confinement through the encapsulation block which reaches the front face of the carrier substrate and exposes the second electrical contacts of the front face of the carrier substrate; placing at least one electronic component in the through-void for positioning and confinement on top of the front face of the carrier substrate, the through-void for positioning and confinement and the electronic component being configured such that there is a clearance between the flanks of the through-void for positioning and confinement and the flanks of the electronic component and that the orientation of the electronic component, parallel to the front face of the carrier substrate, is limited by at least two opposite flanks of the through-void for positioning and confinement; dispensing solder material into the through-void for positioning and confinement, the solder material penetrating into said clearance; and hardening the solder material so that electrical connection terminals of the electronic component are connected to the second electrical contacts of the front face of the carrier substrate by solder bumps or pads that are located in the through-void for positioning and confinement.

The solder material may be dispensed in the form of a powder.

The solder material may be dispensed in the form of a paste.

The distance between the opposite flanks of the through-void for positioning and confinement may be chosen so as to be smaller than the largest dimension of the electronic component parallel to the front face of the carrier substrate.

The electrical connection terminals of the electronic component may be located above the second electrical contacts.

The second electrical contacts may extend beyond the electronic component.

The electrical connection terminals may be formed at opposite ends of the electronic component.

The carrier substrate may be provided with an integrated network of electrical connections from one face to the other, which is connected to the first and second electrical contacts.

The process may comprise: placing a stack of corresponding electrical components on top of the other in the through-void having corresponding electrical connection terminals; dispensing the solder material into the through-void for positioning and confinement, the solder material penetrating into the clearance between the flanks of the through-void and the flanks of the stacked electronic components; and hardening the solder material so that electrical connection terminals of the electronic components are connected to one another and to the second electrical contacts of the front face of the carrier substrate by the solder bumps or pads.

BRIEF DESCRIPTION OF THE DRAWINGS

An electronic device will now be described by way of non-limiting exemplary embodiment, illustrated by the appended drawing, in which.

DETAILED DESCRIPTION

Figure 1:
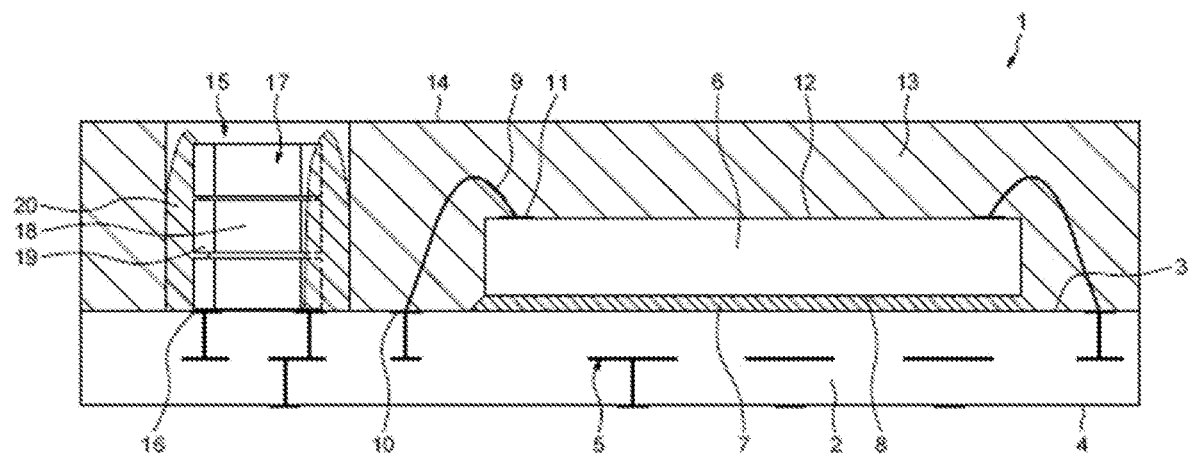
FIG. 1 shows a section through an electronic device.
Figure 2:
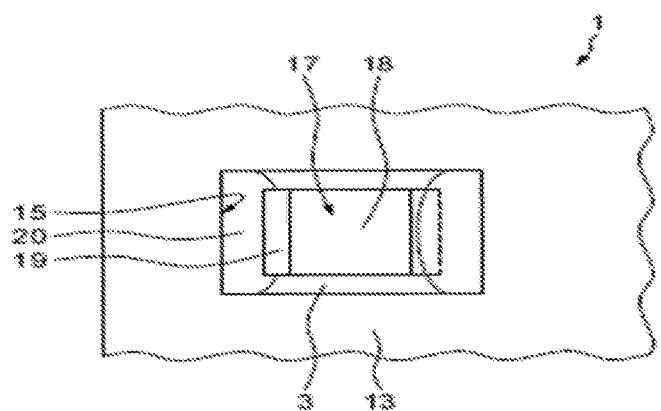
FIG. 2 shows a local view from above of the electronic device of FIG. 1.

As illustrated in FIGS. 1 and 2, an electronic device 1 comprises a carrier substrate 2, made of a dielectric material, that has a front face 3 for mounting and a back face 4 and is provided with an electrical connection network 5 from the front face to the back face.

The electronic device 1 comprises at least one electronic integrated circuit (IC) chip 6 mounted on top of the front face 3 of the carrier substrate 2 via a layer of adhesive 7 interposed between the front face 3 of the carrier substrate 2 and a back face 8 of the IC chip 6.

The IC chip 6 is connected to the electrical connection network 5 via electrical wires 9 that connect first electrical contacts 10 of the front face 3 of the carrier substrate 2 to electrical contacts 11 of a front face 12 of the IC chip 6.

According to one variant embodiment, the IC chip 6 could be mounted on top of the carrier substrate 2 and electrically connected to the electrical connection network 5 via electrical connection elements such as balls, interposed between electrical contacts of the front face 3 of the carrier substrate 2 and electrical contacts of the face 8 of the IC chip 6. Additionally, a layer of adhesive could be interposed between the front face 3 of the carrier substrate 2 and the face 8 of the IC chip 6, in which the electrical connection elements are embedded.

The electronic device 1 comprises an encapsulation block 13 on top of the front face 3 of the carrier substrate 2, in which the IC chip 6 is embedded. The electrical wires 9 are also embedded in the encapsulation block 13.

The encapsulation block 13 has a front face 14 which, for example, extends parallel to the front face 3 of the carrier substrate 2 and a peripheral face which, for example, follows the contour of the carrier substrate 2 and is perpendicular to the front face 3 of the carrier substrate 2.

The encapsulation block 13 has, extending from the front face 14, a through-void 15 for positioning and confinement, which is located at a position away from the IC chip 6 and extends to reach the front face 3 of the carrier substrate 2. The through-void 15 exposes, in the front face 3 of the carrier substrate 2, second electrical contacts 16 of the electrical connection network 5.

The electronic device 1 comprises a corresponding stack 17 of electronic components 18 that are located one on top of the other in the through-void 15 from the front face 3 of the carrier substrate 2.

The through-void 15 for positioning and confinement and the electronic components 18 are configured such that there is a clearance between the flanks of the through-void 15 and the flanks of the electronic components 18 and that the orientation of the electronic components 18, parallel to the front face 3 of the carrier substrate 2, is limited by at least two opposite flanks of the through-void 15 for positioning and confinement.

More particularly, the distance between the opposite flanks of the through-void 15 for positioning and confinement is smaller than the largest dimension of the electronic components parallel to the front face 3 of the carrier substrate 2.

For example, the electronic components 18 take the shape of parallelepipeds that are arranged flat on top of the front face 3 of the carrier substrate 20 one on top of the other and the through-void for positioning and confinement 15 has, parallel to the front face 3 of the carrier substrate 2, a rectangular cross section that is larger than the rectangular cross section of the electronic components in both directions.

The distance between two opposite flanks of the through-void 15 for positioning and confinement is smaller than the diagonal connecting opposite corners of the electronic components 18, such that the orientation of the electronic components is limited by the diagonally opposite corners of the electronic components 18 butting against these two opposite flanks.

The electronic components 18 have corresponding electrical connection terminals 19. More particularly, the electrical connection terminals 19 are formed at opposite ends of the electronic components 18, going around them.

The electrical connection terminals 19 are located one above the other and above the second electrical contacts 16.

More particularly, the electrical connection terminals 19 of the electronic component 18 that is adjacent to the front face 3 of the carrier substrate 2 are located on top of the second electrical contacts 16. The second electrical contacts 16 extend beyond the electronic component 18 adjacent to the front face 3 of the carrier substrate 2.

The electronic components 18 are generally referred to as surface mount technology (SMT) components and may be electrical resistors, capacitors, inductors, or electronic IC chips provided, for example, with side electrical connection legs.

The electronic device 1 comprises solder bumps or pads 20 which electrically connect the corresponding electrical connection terminals 19 of the electronic components 18 to one another and to the second electrical contacts 16 of the front face 3 of the carrier substrate 2. Advantageously, the solder bumps or pads 20 are confined within the clearance between the flanks of the through-void 15 for positioning and confinement and the flanks of the electronic components 18.

The electronic device 1 may be produced individually or in batches, making use of fabrication tools and processes known from the field of microelectronics.

With the carrier substrate 2 provided with the electrical connection network 5, the IC chip 6 is mounted on top of the front face 3 of the carrier substrate, and it is electrically connected to the electrical connection network 5 as described above.

Next, the encapsulation block 13 is produced, for example in a mold.

Next, the through-void 15 for positioning and confinement is produced, for example by means of chemical, mechanical or chemical-mechanical attack.

Next, the electronic components 18 are introduced successively, one on top of the other, into the through-void 15 for positioning and confinement so as to form the stack 17.

By virtue of the relative configuration of the through-void 15 for positioning and confinement and of the electronic components 18, there is a clearance between the flanks of the through-void 15 for positioning and confinement and the flanks of the electronic components 18. Additionally, the orientation of the electronic components 18, parallel to the front face 3 of the carrier substrate 2, is limited by at least two opposite flanks of the through-void 15 for positioning and confinement, the diagonally opposite corners of the electronic components being able to butt against these flanks.

In an embodiment, the through-void has a cross section parallel to the front face of the carrier substrate that is a first rectangular shape defined by a first pair of opposite flanks each having a first length and a second pair of opposite flanks each having a second length. These lengths are specifically chosen relative to the size of the electronic component 18 to ensure a certain orientation. In this regard, the component 18 has a cross section parallel to the front face of the carrier substrate that is a second rectangular shape defined by a third pair of opposite flanks each having a third length less than the first length and greater than the second length and a fourth pair of opposite flanks each having a fourth length less than the second length.

Next, solder material is introduced into the through-void 15 for positioning and confinement, the solder material penetrating into the clearance between the flanks of the through-void 15 for positioning and confinement and the flanks of the electronic components 18, while being confined within this clearance.

The solder material may be dispensed in the form of a powder or in the form of a paste, by spreading or by using a pipette.

Next, the solder material is hardened so that electrical connection terminals 19 of the electronic components are connected to one another and to the second electrical contacts 16 of the front face 3 of the carrier substrate 2 by the solder bumps or pads 20. It may be hardened by means of a heat treatment or by means of light radiation.

In a batch production process, there is a collective carrier substrate that has, at sites, networks 5 of electrical connections, these sites being aligned in rows and columns.

At each site, an IC chip 6 is mounted and connected on top of the collective carrier substrate.

Next, a collective encapsulation block, in which the IC chips 6 are embedded, is formed.

Next, at each site, a through-void 15 for positioning and confinement is made, the electronic components 18 are placed in the through-voids 15 for positioning and confinement, solder material is introduced into the through-voids 15 for positioning and confinement and the solder material is hardened so as to form solder bumps or pads 20.

After this, the collective carrier substrate and the collective encapsulation block are cut along the lines and columns in order to separate the sites so as to obtain, at each site, an electronic device 1.

The invention claimed is:

1. An electronic device, comprising:
   a carrier substrate having a front face and a back face;
   an electronic integrated circuit (IC) chip mounted on top of the front face of the carrier substrate and connected to first front electrical contacts at the front face of the carrier substrate;
   an encapsulation block on top of the front face of the carrier substrate in which the IC chip is embedded;
   wherein the encapsulation block has a through-void for positioning and confinement, said through-void reaching the front face of the carrier substrate; and
   at least one electronic component on top of the front face of the carrier substrate and provided with electrical connection terminals that are connected to second front electrical contacts at the front face of the carrier substrate by solder bumps or pads, wherein said at least one electronic component and solder bumps or pads are located within the through-void;
   wherein the through-void and the at least one electronic component are configured such that there is a clearance between at least two opposite flanks of the through-void and flanks of the electronic component; and
   wherein an orientation of the at least one electronic component, parallel to the front face of the carrier substrate, is limited by said at least two opposite flanks of the through-void, wherein said at least one electronic component comprises a stack of electronic components that are located one on top of another in the through-void, each electronic component of the stack having corresponding electrical connection terminals that are connected to one another and to the second front electrical contacts, the second front electrical contacts being part of a network of electrical connections, by the solder bumps or pads.

2. The device according to claim 1, wherein a distance between the at least two opposite flanks of the through-void is smaller than a largest dimension of the at least one electronic component parallel to the front face of the carrier substrate.

3. The device according claim 1, wherein the electrical connection terminals of the at least one electronic component are located above the second front electrical contacts.

4. The device according to claim 1, wherein the second front electrical contacts extend beyond the at least one electronic component.

5. The device according to claim 1, wherein the electrical connection terminals are formed at opposite ends of the at least one electronic component.

6. The device according to claim 1, wherein the carrier substrate is provided with an integrated network of electrical connections from the front face to back face, said integrated network of electrical connections including the first and second front electrical contacts.

7. An electronic device, comprising:
   a carrier substrate having a front face and a back face;
   an electronic integrated circuit (IC) chip mounted on top of the front face of the carrier substrate and connected to first front electrical contacts at the front face of the carrier substrate;
   an encapsulation block on top of the front face of the carrier substrate in which the IC chip is embedded;
   wherein the encapsulation block has a through-void for positioning and confinement, said through-void reaching the front face of the carrier substrate; and
   at least one electronic component comprising a stack of electronic components that are located one on top of another and on top of the front face of the carrier substrate within the through-void, each electronic component of the stack having corresponding electrical connection terminals that are connected to one another and to the second front electrical contacts at the front face of the carrier substrate by the solder bumps or pads;
   wherein the through-void and the at least one electronic component are configured such that there is a clearance between at least two opposite flanks of the through-void and flanks of the at least one electronic component; and
   wherein an orientation of the at least one electronic component, parallel to the front face of the carrier substrate, is limited by said at least two opposite flanks of the through-void.

8. The device according to claim 7, wherein a distance between the at least two opposite flanks of the through-void is smaller than a largest dimension of said stack of electronic components parallel to the front face of the carrier substrate.

9. The device according claim 7, wherein the electrical connection terminals of the stack of electronic components are located above the second front electrical contacts.

10. The device according to claim 7, wherein the second front electrical contacts extend beyond the stack of electronic components.

11. The device according to claim 7, wherein the electrical connection terminals are formed at opposite ends of each electronic component of said stack of electronic components.

12. The device according to claim 7, wherein the carrier substrate is provided with an integrated network of electrical connections from the front face to back face, said integrated network of electrical connections including the first and second front electrical contacts.

13. An electronic device, comprising:
a carrier substrate having a front face and a back face;
an electronic integrated circuit (IC) chip mounted to the front face of the carrier substrate;
an encapsulation block at the front face of the carrier substrate which embeds the IC chip, wherein the encapsulation block has a through-void reaching the front face of the carrier substrate, said through-void having a cross section parallel to the front face that is a first rectangular shape defined by a first pair of opposite flanks each having a first length and a second pair of opposite flanks each having a second length; and
at least one electronic component mounted to the front face of the carrier substrate in said through-void, wherein said at least one electronic component has a cross section parallel to the front face that is a second rectangular shape defined by a third pair of opposite flanks each having a third length less than the first length and greater than the second length and a fourth pair of opposite flanks each having a fourth length less than the second length;
front electrical contacts at the front face of the carrier substrate in said through-void, and wherein the at least one electronic component includes electrical connection terminals that are electrically connected to said front electrical contacts;
wherein said at least one electronic component comprises a stack of electronic components that are located one on top of another in the through-void and electrically connected to each other and said front electrical contacts.

14. The device according to claim 13, wherein the carrier substrate is provided with an integrated network of electrical connections from the front face to back face, said integrated network of electrical connections including the front electrical contacts.

15. An electronic device, comprising:
a carrier substrate having a front face and a back face;
an electronic integrated circuit (IC) chip mounted to the front face of the carrier substrate;
an encapsulation block at the front face of the carrier substrate which embeds the IC chip, wherein the encapsulation block has a through-void reaching the front face of the carrier substrate, said through-void having a cross section parallel to the front face that is a first rectangular shape defined by a first pair of opposite flanks each having a first length and a second pair of opposite flanks each having a second length; and
at least one electronic component mounted to the front face of the carrier substrate in said through-void, wherein said at least one electronic component has a cross section parallel to the front face that is a second rectangular shape defined by a third pair of opposite flanks each having a third length less than the first length and greater than the second length and a fourth pair of opposite flanks each having a fourth length less than the second length;
wherein said at least one electronic component comprises a stack of electronic components that are located one on top of another in the through-void, and wherein the fourth pair of opposite flanks of each electronic component in the stack include electrical connection terminals, wherein said electrical connection terminals are connected to each other and are connected to front electrical contacts at the front face of the carrier substrate by solder bumps or pads.

16. The device according to claim 15, wherein said solder bumps or pads fill a space between the fourth pair of opposite flanks of each electronic component in the stack and the second pair of opposite flanks of said through-void.

17. The device according to claim 15, wherein the carrier substrate is provided with an integrated network of electrical connections from the front face to the back face, said integrated network of electrical connections including the front electrical contacts.

18. An electronic device, comprising:
a carrier substrate having a front face and a back face;
an electronic integrated circuit (IC) chip mounted to the front face of the carrier substrate;
an encapsulation block at the front face of the carrier substrate which embeds the IC chip, wherein the encapsulation block has a through-void reaching the front face of the carrier substrate, said through-void having a cross section parallel to the front face that is a first rectangular shape defined by a first pair of opposite flanks each having a first length and a second pair of opposite flanks each having a second length; and
at least one electronic component mounted to the front face of the carrier substrate in said through-void, wherein said at least one electronic component has a cross section parallel to the front face that is a second rectangular shape defined by a third pair of opposite flanks each having a third length less than the first length and greater than the second length and a fourth pair of opposite flanks each having a fourth length less than the second length;
wherein the fourth pair of opposite flanks include electrical connection terminals for said at least one electronic component, wherein said electrical connection terminals are connected to front electrical contacts at the front face of the carrier substrate by solder bumps or pads.

19. The device according to claim 18, wherein said solder bumps or pads fill a space between the fourth pair of opposite flanks of said at least one electronic component and the second pair of opposite flanks of said through-void.

20. The device according to claim 18, wherein the carrier substrate is provided with an integrated network of electrical connections from the front face to the back face, said integrated network of electrical connections including the front electrical contacts.

* * * * *